United States Patent

Baek

[11] Patent Number: 6,084,925
[45] Date of Patent: Jul. 4, 2000

[54] METHOD AND APPARATUS FOR DISCRIMINATING SYNCHRONOUS OR ASYNCHRONOUS STATES OF VITERBI DECODED DATA

[75] Inventor: Jong Seob Baek, Kyoungkido, Rep. of Korea

[73] Assignee: Hyundai Electronics Industries Co., Ltd., Rep. of Korea

[21] Appl. No.: 08/884,685

[22] Filed: Jun. 27, 1997

[30] Foreign Application Priority Data

Jun. 29, 1996 [KR] Rep. of Korea ............... 96-26546

[51] Int. Cl.⁷ .................................................. H04L 27/06
[52] U.S. Cl. ..................... 375/341; 714/789; 714/795
[58] Field of Search ................................ 375/340, 341, 375/262, 265; 714/789, 791, 794, 795

[56] References Cited

U.S. PATENT DOCUMENTS

| | | | |
|---|---|---|---|
| 4,462,101 | 7/1984 | Yasuda et al. | 371/43.6 |
| 4,764,730 | 8/1988 | Miyo et al. | 329/307 |
| 4,802,174 | 1/1989 | Hiraiwa et al. | 371/46 |
| 5,335,250 | 8/1994 | Dent et al. | 375/224 |
| 5,583,889 | 12/1996 | Citta et al. | 375/341 |
| 5,787,127 | 7/1998 | Ono et al. | 375/341 |
| 5,809,044 | 9/1998 | Todoroki | 371/43.1 |
| 5,841,478 | 11/1998 | Hu et al. | 348/426 |
| 5,859,861 | 1/1999 | Oh | 371/43.7 |

FOREIGN PATENT DOCUMENTS

| | | |
|---|---|---|
| 0233788 | 8/1987 | European Pat. Off. . |
| 0425153 | 5/1991 | European Pat. Off. . |
| 0603824 | 6/1994 | European Pat. Off. . |
| 59-104842 | 6/1984 | Japan . |
| 62-233933 | 10/1987 | Japan . |
| 9-181619 | 7/1997 | Japan . |

OTHER PUBLICATIONS

The Transactions of the Institute of Electronics and Communication Engineers of Japan, vol. No. 5, pp. 623–630. Synchronisation etc. by Dai–II Oh and Sun–Young Hwang, Electronics Letters, Vo. 32, No. 13 pp. 1173–75 Jun. 20, 1996.

*Primary Examiner*—Young T. Tse
*Attorney, Agent, or Firm*—Blakely Sokoloff Taylor & Zafman

[57] ABSTRACT

A method and apparatus for discriminating synchronous or asynchronous states of Viterbi decode data, by performing independent trace-back of the survival path of the received Viterbi decode data, including the steps of: tracing back independently reception data at respective initial states on the basis of trellis metrics from a different initial state value; and comparing a state value with other state values at every cycle, and determining that the data is in a synchronous state, if the state value is identical to the other state values at a cycle, or determining that the data is in an asynchronous state, if not.

4 Claims, 4 Drawing Sheets

METHOD AND APPARATUS FOR DISCRIMINATING SYNCHRONOUS OR ASYNCHRONOUS STATES OF VITERBI DECODED DATA

BACKGROUND OF THE INVENTION

1. Field of the Invention

The present invention relates to a method and apparatus for discriminating synchronous or asynchronous states of Viterbi decode data, by performing independent trace-back of the survival path of the received data at the Viterbi decoder.

2. Description of the Prior Art

A Viterbi decoder is a decoder which uses the Viterbi algorithm to decode the convolutional encoded data and is well known. The convolutional encoding and the Viterbi algorithm are used for correcting errors caused by transmitting and recoding data in digital communication. In Viterbi decoding the convolutional encoded data, it should be determined whether the decode data is synchronous or asynchronous. That is to say, any apparatus using the Viterbi decoding algorithm, for example, a high definition television, a digital satellite communication, a digital cable television, a hard disk drive and a floppy disk drive, should determine whether the received data is synchronous or asynchronous. In the prior art, there are two methods for discriminating synchronous or asynchronous states of the received data.

Referring to FIG. 1, first, the convolutional encoded data is decoded in the Viterbi decoder 1. Then, the output data of the Viterbi decoder 1 is convolutional reencoded by a convolutional encoder 3. The delayer 2 delays the received data, then a comparator 4 compares the delayed data with the convolutional reencoded data. If the convolutional reencoded data is identical to the delayed received data, there is no error in the transmission of data. If a small portion of the convolutional reencoded data is not identical to the delayed received data, there is an error in the transmission of data. If a large portion of the convolutional reencoded data is not identical to the delayed received data, the decoded data is not synchronized to the delayed received data. The method relating to FIG. 1 has a problem in which the difference between a small portion and a large portion of no identification is unclear.

In another method for determining synchronization, a minimum value of the path metric is selected at every cycle when the convolutional encoded data is Viterbi decoded. Then, the difference between the present minimum value and the next cycle minimum value is examined. If the difference is less than a threshold value which is determined experimentally, it is determined to be in a synchronous state. If the difference is more than the threshold value, it is determined to be in an asynchronous state. In this case, it is difficult to implement the circuit for selecting the minimum value of the path metric. Also, it is difficult to decide the threshold value.

Therefore, it is an object of the present invention to provide a method and apparatus which determines synchronous or asynchronous of the Viterbi decoded data by the independent multiple trace-back of the transmission path of the convolutional encoded data.

SUMMARY OF THE INVENTION

According to one embodiment of the invention, this object is accomplished by a method for discriminating synchronous or asynchronous states of Viterbi decode data including the steps of:

tracing back independently reception data at respective initial states on the basis of trellis metrics from a different initial state value; and comparing a state value with other state values at every cycle, and determining that the data is synchronous state, if the state value is identical to the other state values at a cycle, or determining that the data is asynchronous state, if not.

According to another embodiment of the invention, this object is accomplished by an apparatus for discriminating synchronous or asynchronous states of Viterbi decode data comprising:

trace-back memory for storing survival path data of Viterbi decode data;

a plurality of trace-back registers having a different initial state value, for updating initial state value in accordance with data from the trace-back memory; and a comparing means for comparing the updated state value with other updated states values.

The above and other objects and features of the present invention will become apparent from the following detailed description and appended claims, with reference to the accompanying drawings.

DESCRIPTION OF THE PREFERRED EMBODIMENTS

When any convolutional code is decoded by a Viterbi decoder, the selected path is determined by the trace-back of trellis-metrics. In other words, the decision of the selected path means that although it starts the trace-back at any initial state, it is converged on a particular state after some cycles. In the present invention, if the result state is the same, after independent trace-back at the same initial state is performed for a predetermined cycle, it is determined that Viterbi decoding is in a synchronizing state. On the other hand, if the result state is not the same, it is determined that the Viterbi decoding is the in an asynchronizing state.

Figure 1:
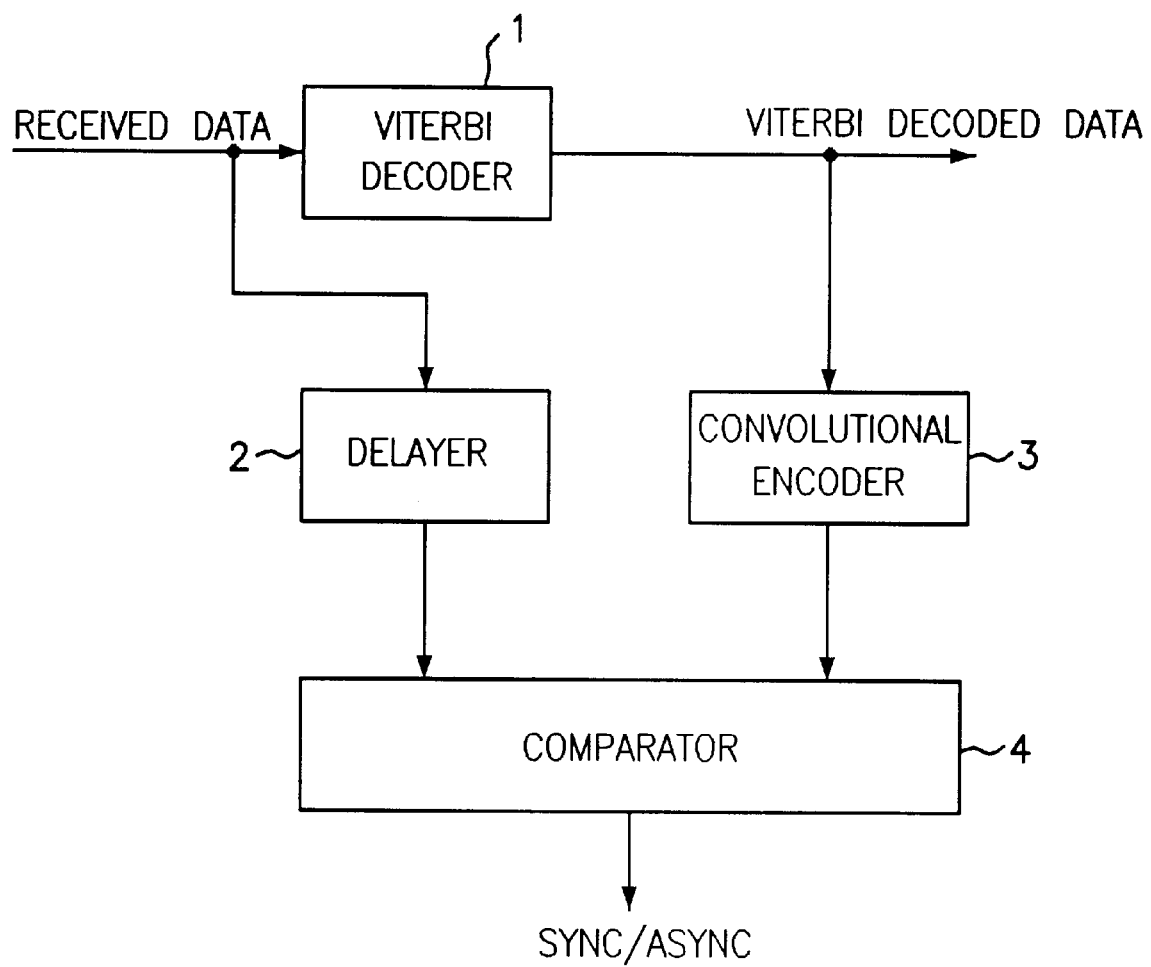
FIG. 1 is a block diagram illustrating the Viterbi decoder in accordance with the prior art.
Figure 2:
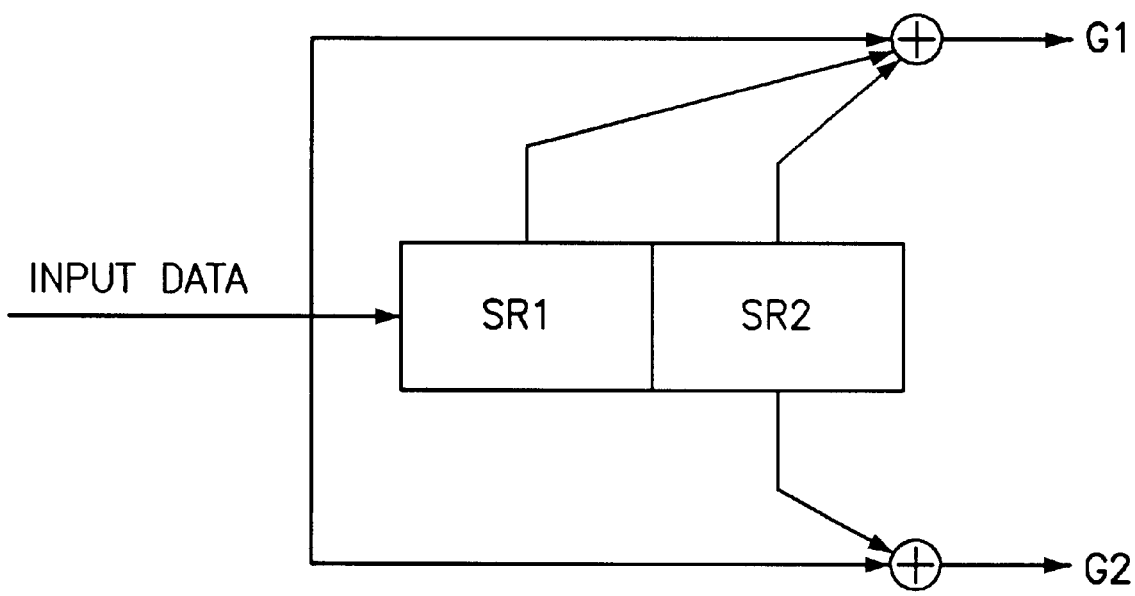
FIG. 2 is a block diagram of a convolutional encoder for producing a convolutional code.

Referring to FIG. 2, a convolutional encoder for producing a convolutional code (at the transmission side) is illustrated. An input information bit is supplied from an input terminal to a shift register consisting of bit registers SR1 and SR2. A total of three bits consisting of the input information bit and previous information bits, respectively stored in the registers SR1 and SR2, are supplied to an exclusive-OR gate and an exclusive OR of the respective bits is calculated. On the other hand, the input information bit and the information bit stored in the register SR2 are supplied to an exclusive OR-gate and an exclusive OR of these information bits is also calculated. Transmission bits G1 and G2 are derived from the exclusive OR-gates. These transmission bits are presented as a composite output at an output terminal.

The reception side receives each information bit corresponding to a pair of transmission bits G1 and G2. Therefore, it can be recognized that there are errors in the data transmission path, if reception data at the reception side is not identical to the transmission data from the transmission side. Variations of state in accordance with the input data, and variations of transmission data and reception data are described as shown in the following table I.

TABLE I

| Input Data | Present State | Next State | Transmission Data(G1,G2) | Reception Data(g1,g2) |
|---|---|---|---|---|
| 0 | 00 | 00 | 00 | 00 |
| 1 | 00 | 10 | 11 | 11 |
| 1 | 10 | 11 | 01 | 11 |
| 0 | 11 | 01 | 01 | 01 |
| 1 | 01 | 10 | 00 | 00 |
| 0 | 10 | 01 | 10 | 10 |
| 1 | 01 | 10 | 00 | 00 |
| 1 | 10 | 11 | 01 | 11 |
| 0 | 11 | 01 | 01 | 01 |
| 0 | 01 | 00 | 11 | 11 |

The present state represents the state of the shift registers SR1 and SR2 in FIG. 2. The next state represents the state of input data and the sift register SR1.

The Viterbi decoder decodes input data g1 and g2 on the reception side. If the data on the reception side is not identical to the data on the transmission side, there is an error on the transmission path. When synchronizing state or asynchronizing state can be discriminated, it can be determinated whether input data on the reception side is correct or not. The synchronizing/asynchronizing state can be discriminated by using trellis-metrics, as shown in FIG. 3 and table II.

Figure 3:
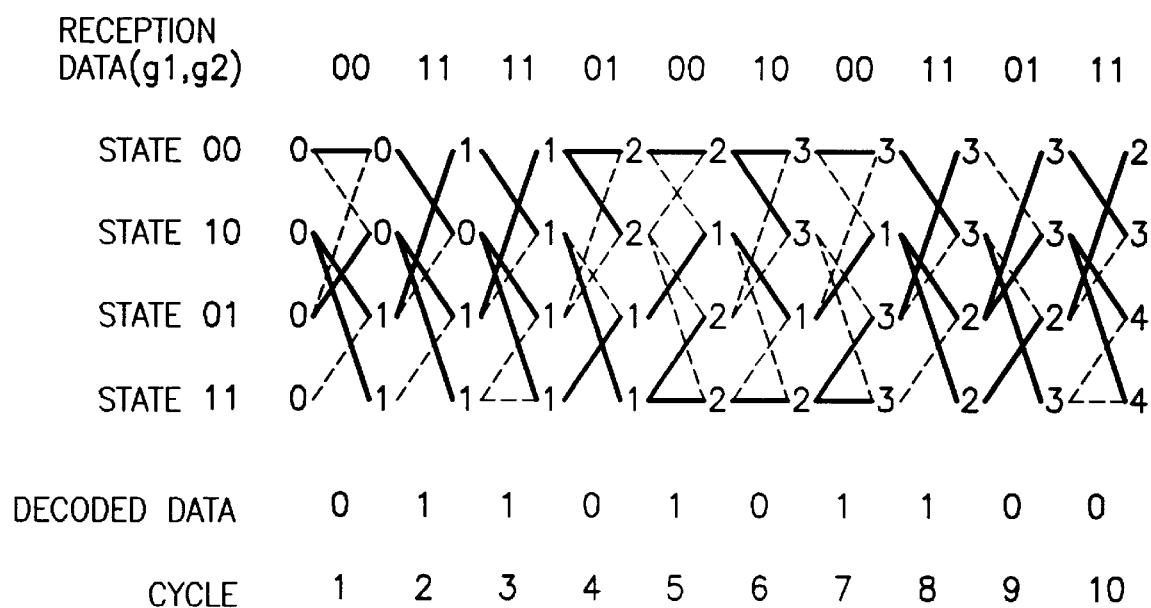
FIG. 3 is a diagram of a trellis-metrics illustrating the data transmission path of the received data.

FIG. 3 is a diagram of a trellis-metrics illustrating data transmission path of the received data. In FIG. 3, the solid lines represent the survival path, which means the path substantially passed from the respective initial state 00, 10, 01, and 11 to the present state, and the dotted lines represent the path which is considered to be probable to pass. The trace-back is carried out by checking the preceding initial state for the present state of the reception data along the survival paths every clock and by comparing the preceding states which are traced back. While such a trace-back is performed during predetermined cycles, the traced preceding states are converged on an initial state. As showing in FIG. 3, in four independent trace-backs starting from all states 00, 01, 10, and 11, the trace-back starts from cycle 10 and becomes to have the same state value at cycle 7 as shown in the following table II. In this case, the code is called synchronizing state. On the contrary, in case that the state is not converged after some cycles, the code is determined as an asynchronizing state.

TABLE II

| Cycle | Initial State 00 | Initial State 10 | Initial State 01 | Initial State 11 |
|---|---|---|---|---|
| 10 | 00 | 10 | 01 | 11 |
| 9 | 01 | 00 | 10 | 10 |
| 8 | 11 | 01 | 01 | 01 |
| 7 | 10 | 10 | 10 | 10 |
| 6 | 01 | 01 | 01 | 01 |
| ... | ... | ... | ... | ... |

Figure 4:
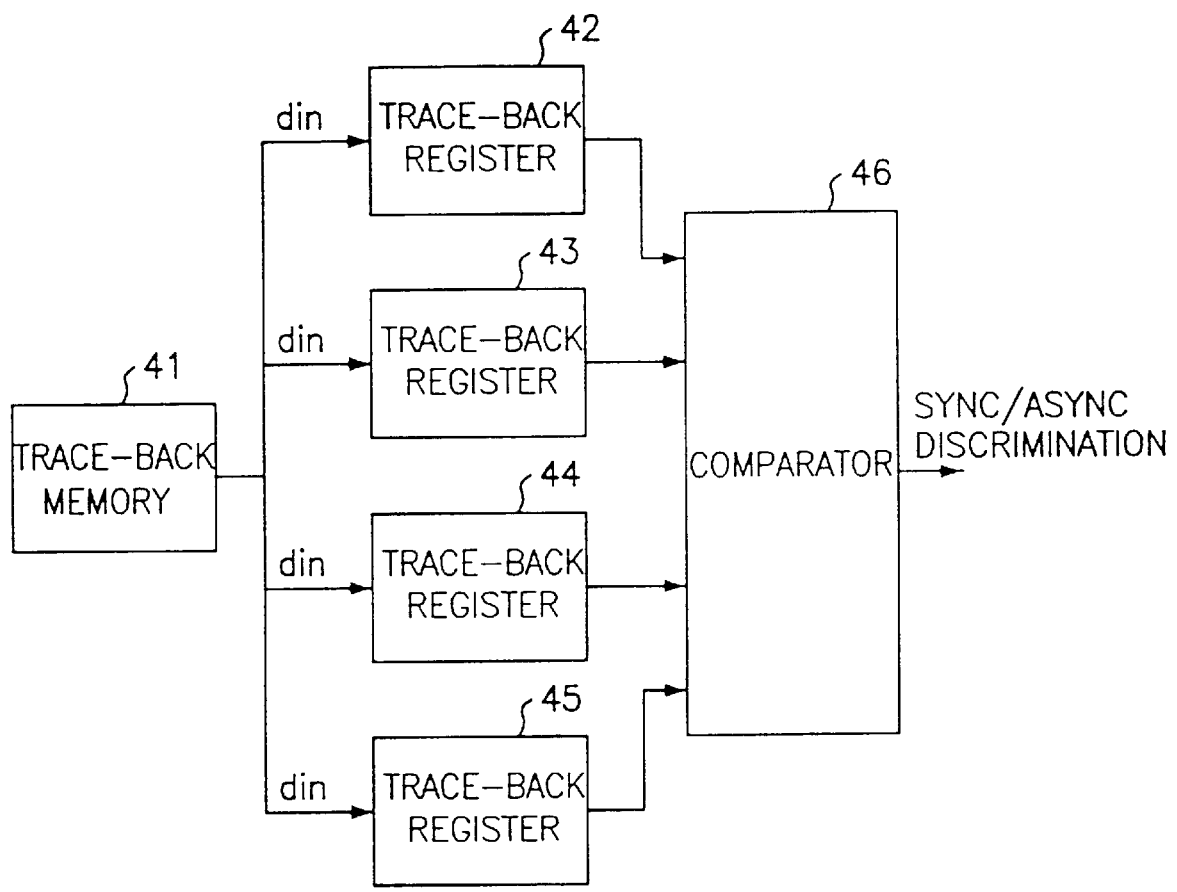
FIG. 4 is a block diagram illustrating a Viterbi decoder in accordance with the present invention.

FIG. 4 is a block diagram illustrating the Viterbi decoder in accordance with the present invention. The above-mentioned Viterbi decoder is implemented by a synchronization/asynchronization decision circuit, as shown in FIG. 4. As described above, data to be transmitted from the transmission side is convolutional encoded by using the two shift registers SR1 and SR2 and a trace-back memory 41 stores survival paths of the data. Therefore, trace-back registers 42 to 45 are necessary to trace back the respective initial state of transmission data. The respective trace-back registers 42 to 45 search survival paths corresponding to the respective initial state and provides the traced back data to the respective input terminal.

Next, a comparator 46 compares the output values of these trace-back registers with each other every cycle (in order cycle 10, 9, 8, ...). After predetermined cycles, if the output values of the trace-back registers are identical to each other, the comparator 46 determines that the code is synchronizing. If not, the comparator 46 determines that the code is asynchronizing.

According to the present invention, it can discriminates synchronous or asynchronous states of the Viterbi decoded data using a plurality of trace-back registers without an additional delayer and circuits. Also, since the quality of the code data can be determined by using the converging speed of all the state registers, the position of the external antenna can be adjusted in accordance with the quality of the code data.

What is claimed is:

1. An apparatus for discriminating synchronous or asynchronous states of Viterbi decode data comprising:

trace-back memory for storing survival path data of Viterbi decode data;

a plurality of trace-back registers, each of which stores preceding stage value taken along said survival path data from said trace-back memory on the basis of trellis metrics and updates said preceding state value in accordance with said survival path data from said trace-back memory; and a comparing means for comparing said preceding state values stored in the trace-back registers every cycle wherein if said preceding state values are the same during a predetermined period, the Viterbi decode data are determined as being in the synchronous condition and, if not, in the asynchronous condition.

2. An apparatus as claimed in claim 1, wherein said predetermined period is selected by a user.

3. A method for discriminating synchronous or asynchronous states of Viterbi decode data including the steps of:

storing survival path data of Viterbi decode data in a trace-back memory;

independently storing in a plurality of trace-back registers preceding state values taken along said survival path data from said trace-back memory on the basis of trellis metrics;

comparing said preceding state values stored in the trace-back registers every cycle, wherein if said preceding state values are the same during a predetermined period, the Viterbi decode data are determined as being in the synchronous condition and, if not, in the asynchronous condition.

4. A method as claimed in claim 3, wherein said predetermined period is selected by a user.

* * * * *

UNITED STATES PATENT AND TRADEMARK OFFICE
CERTIFICATE OF CORRECTION

PATENT NO.: 6,084,925
DATED: July 4, 2000
INVENTOR(S): Baek

It is certified that error appears in the above-identified patent and that said Letters Patent is hereby corrected as shown below:

In References Cited, Item [56], delete "6/1984    Japan – " and insert -- 6/1984    Japan – H 04 L 7 --.

In References Cited, Item [56], delete "10/1987    Japan – " and insert -- 10/1987    Japan – H 03 M 13 --.

In References Cited, Item [56], delete "7/1997    Japan – " and insert -- 7/1997    Japan – H 03 M 13 --.

Signed and Sealed this

Twenty-second Day of May, 2001

*Attest:*

NICHOLAS P. GODICI

*Attesting Officer*    Acting Director of the United States Patent and Trademark Office